US010123460B2

(12) United States Patent
Rupp et al.

(10) Patent No.: US 10,123,460 B2
(45) Date of Patent: Nov. 6, 2018

(54) SYSTEM AND METHOD FOR THERMAL MANAGEMENT OF ELECTRONIC DEVICES

(71) Applicant: COVIDIEN LP, Mansfield, MA (US)

(72) Inventors: Steven C. Rupp, Arvada, CO (US);
Daniel A. Friedrichs, Aurora, CO (US); Robert B. Smith, Loveland, CO (US)

(73) Assignee: COVIDIEN LLP, Mansfield, MA (US)

( * ) Notice: Subject to any disclaimer, the term of this patent is extended or adjusted under 35 U.S.C. 154(b) by 0 days.

(21) Appl. No.: 15/339,988

(22) Filed: Nov. 1, 2016

(65) Prior Publication Data

US 2017/0142858 A1    May 18, 2017

Related U.S. Application Data

(60) Provisional application No. 62/254,791, filed on Nov. 13, 2015.

(51) Int. Cl.
*H05K 7/20* (2006.01)
*H05K 1/02* (2006.01)
*H05K 13/04* (2006.01)

(52) U.S. Cl.
CPC .......... *H05K 7/205* (2013.01); *H05K 1/0203* (2013.01); *H05K 1/0213* (2013.01); *H05K 13/0486* (2013.01); *H05K 2201/06* (2013.01); *H05K 2201/066* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 5,075,759 A | 12/1991 | Moline | |
| 5,353,191 A | 10/1994 | Volz et al. | |
| 5,492,482 A * | 2/1996 | Lockman | G01K 7/12 136/235 |
| 5,510,649 A | 4/1996 | Adhihetty et al. | |
| 5,653,280 A | 8/1997 | Porter | |
| 5,854,511 A | 12/1998 | Shin et al. | |

(Continued)

FOREIGN PATENT DOCUMENTS

| | | |
|---|---|---|
| CM | 103681523 A | 3/2014 |
| CN | 2065806 U | 11/1990 |

(Continued)

OTHER PUBLICATIONS

Henkel, Thermal Materials, Thermal Solutions, Sil-Pad Products, http://www.bergquistcompany.com/thermal_materials/sil-pad.htm, accessed Jan. 25, 2017, 2 pages.

(Continued)

*Primary Examiner* — Courtney Smith (57) ABSTRACT

A thermal management system and method for electronic devices is provided. The system includes an electronic device, a heat sink, and a thermally conducting and electrically insulating thermal bridge that is interposed between the electronic device and the heat sink. The thermal bridge thermally couples the electronic device to the heat sink and electrically isolates the electronic device from the heat sink. The electronic device, the heat sink, and the thermal bridge are mounted on a same planar surface of a printed circuit board.

14 Claims, 5 Drawing Sheets

(56) References Cited

U.S. PATENT DOCUMENTS

| | | | |
|---|---|---|---|
| 6,195,256 B1* | 2/2001 | Tiziani | H01L 23/367 |
| | | | 165/80.2 |
| 6,293,700 B1* | 9/2001 | Lund | G01K 7/13 |
| | | | 374/181 |
| 6,373,133 B1 | 4/2002 | DiGiacomo et al. | |
| 6,423,940 B1* | 7/2002 | Schupbach | G05D 23/1919 |
| | | | 219/209 |
| 6,625,025 B1 | 9/2003 | Duxbury et al. | |
| 6,661,661 B2 | 12/2003 | Gaynes et al. | |
| 7,321,107 B2 | 1/2008 | Yagnik et al. | |
| 7,851,906 B2* | 12/2010 | Alcoe | H01L 23/10 |
| | | | 257/706 |
| 8,441,796 B2* | 5/2013 | Morse | C25D 11/04 |
| | | | 174/258 |
| 2002/0017715 A1 | 2/2002 | Giacomo et al. | |
| 2002/0039282 A1 | 4/2002 | Han et al. | |
| 2004/0226696 A1* | 11/2004 | Huang | H05K 1/0209 |
| | | | 165/104.33 |
| 2011/0013365 A1* | 1/2011 | Oota | B62D 5/0406 |
| | | | 361/707 |
| 2012/0098117 A1 | 4/2012 | Sato et al. | |
| 2014/0160684 A1 | 6/2014 | Wittenberg et al. | |

FOREIGN PATENT DOCUMENTS

| | | |
|---|---|---|
| CN | 1825001 A | 8/2006 |
| CN | 101431578 A | 5/2009 |
| CN | 101431878 A | 5/2009 |
| CN | 201623944 U | 11/2010 |
| CN | 103681523 A | 3/2014 |
| CN | 103871983 A | 6/2014 |
| CN | 103974598 A | 8/2014 |
| CN | 203912432 U | 10/2014 |
| CN | 207022344 U | 2/2018 |
| EP | 1696717 A2 | 8/2006 |
| EP | 1739744 A2 | 1/2007 |
| JP | H0160545 U | 4/1989 |
| JP | H0476943 A | 3/1992 |
| JP | H09307031 A | 11/1997 |
| JP | H10308484 A | 11/1998 |
| JP | 2003031742 A | 1/2003 |
| JP | 2003264388 A | 9/2003 |

OTHER PUBLICATIONS

Aavid Thermalloy, Interface Materials, In-Sil-8, <http://www.aavid.com/product-group/interface/pads/insil>, accessed Jan. 25, 2017, 3 pages.

Laird, Thermal Management, Thermal Materials, Tgard TNC-4, <http://www.lairdtech.com/products/tgard-tnc-4>, accessed Jan. 25, 2017, 5 pages.

European Search Report dated Mar. 24, 2017 in corresponding European Patent Application No. 16198323, 8 pages.

Australian Examination Report dated Jul. 13, 2017 in corresponding Australian Patent Application No. 2016256827, 3 pages.

Japanese Office Action dated Oct. 19, 2017 in corresponding Japanese Patent Application No. 2016-220539 together with English translation, 8 pages.

Canadian Office Action dated Sep. 5, 2017 in corresponding Canadian Patent Application No. 2,947,825, 3 pages.

Chinese Office Action dated Jul. 18, 2018 in corresponding Chinese Patent Application No, 201611040807.3, together with English translation, 20 pages.

Chinese Office Action dated Jul. 16, 2018 in corresponding Chinese Patent Application No. 2016110408073, together with English translation, 20 pages.

* cited by examiner

FIG. 1

*(PRIOR ART)*

FIG. 2

*(PRIOR ART)*

SYSTEM AND METHOD FOR THERMAL MANAGEMENT OF ELECTRONIC DEVICES

CROSS REFERENCE TO RELATED APPLICATION

The present application claims the benefit of and priority to U.S. Provisional Application Ser. No. 62/254,791, filed on Nov. 13, 2015, the entire contents of which are incorporated herein by reference.

TECHNICAL FIELD

The present disclosure relates to electronic circuitry. More particularly, the present disclosure relates to a thermal management system and method for electronic devices.

BACKGROUND

Figure 1:
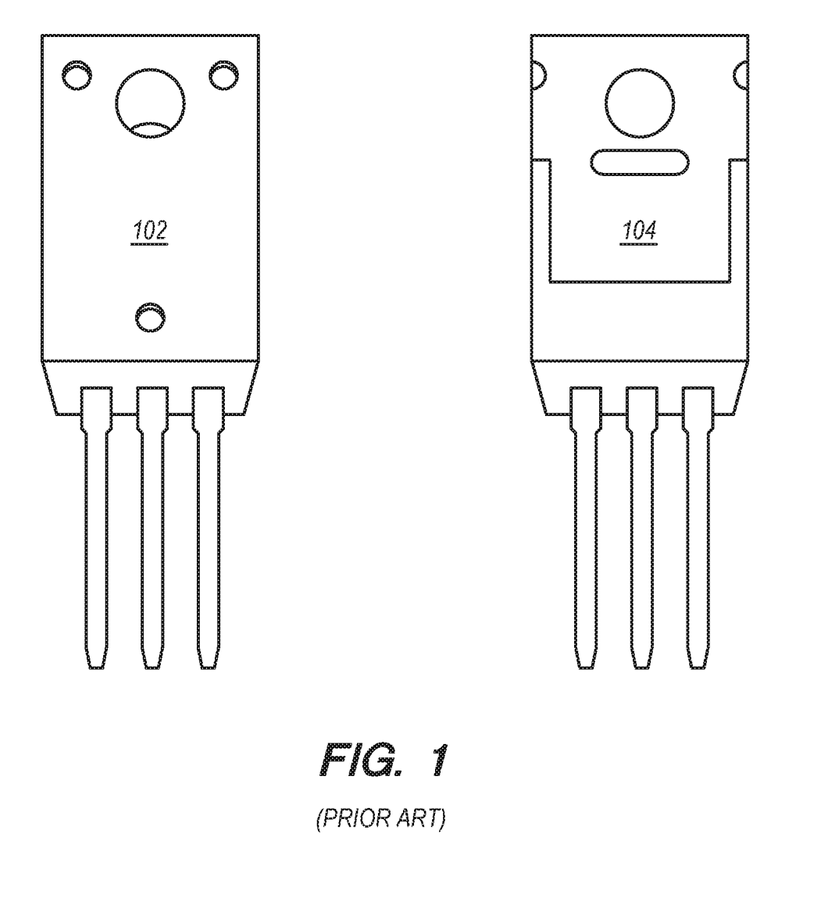
FIG. 1 depicts an example of a top view and a bottom view of an exposed tab package.
Figure 2:
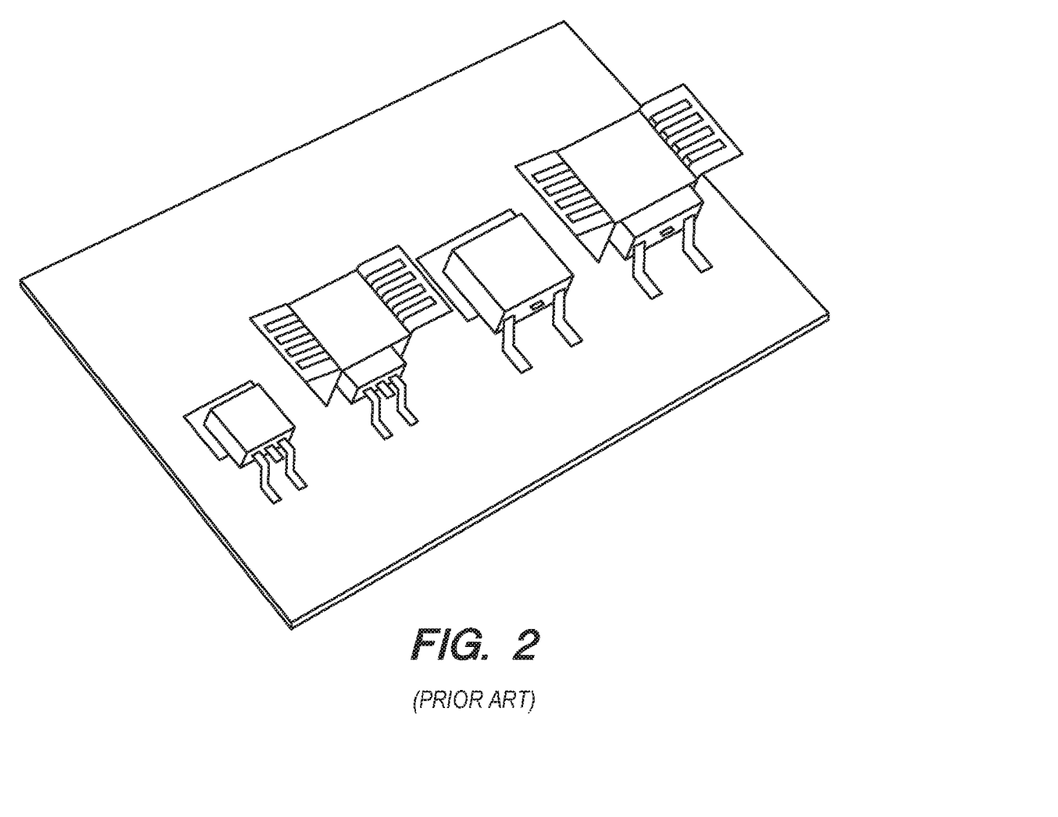
FIG. 2 illustrates exposed-tab semiconductors solder-mounted to a printed circuit board.

Semiconductors, such as transistors and diodes, are sometimes fabricated in a semiconductor package wherein the mechanical mounting is combined with an electrical connection. An example of a top view 102 and a bottom view 104 of such a package, which is sometimes referred to as an exposed tab package, is shown in FIG. 1. Exposed tab semiconductor packages are sometimes employed instead of encapsulated packages, because exposed tab packages may exhibit better heat transfer, power handling, and current handling capabilities than encapsulated semiconductor packages. Exposed tab semiconductor packages are available in at least two configurations—one configuration, as shown in FIG. 1, designed to be mounted using mechanical hardware (such as a screw, a nut, and/or an insulator) and another configuration, as illustrated in FIG. 2, designed to be solder-mounted to a solderable surface of a printed circuit board (PCB) or another solderable surface. Each exposed tab package configuration has its advantages and disadvantages.

Some benefits of employing the hardware-mounted exposed tab semiconductor package include that: (1) the PCB area and copper pours required for the device are minimized; (2) the mechanical mounting is rugged and secure; (3) the thermal conductivity from the semiconductor to its mounting and/or heat sink is significantly improved; and (4) the mechanical hardware can provide electrically isolated devices.

Some drawbacks of employing the hardware-mounted exposed tab semiconductor package include: (1) the additional mounting hardware required to secure the devices; (2) the manual labor that may be required to install the mechanical hardware may incur additional component and assembly costs; (3) the manual nature of the assembly can be error prone; (4) when a common heat sink is used for multiple semiconductor devices, the devices that have different voltages on their respective exposed tabs must be electrically isolated from the heat sink and/or from each other; and (5) device repair and/or replacement can be time consuming.

Some benefits of employing the solder-mounted exposed tab semiconductor package include: (1) the thermal conductivity from the semiconductor device to the PCB and its associated mounting and/or heat sink is significantly improved; (2) the electrical circuit parasitics can be reduced due to shorter and more direct electrical connection between the device and the solderable surface; (3) the generation of and susceptibility to electromagnetic interference by the device can be reduced by virtue of the reduced electrical circuit parasitics; (4) the ability to use solder, which can be inexpensive and machine-installed, as the mechanical mounting means; and (5) the flexibility in being able to pick-and-place-mount the device in many possible PCB locations.

When the solder-mounted exposed tab semiconductor package is employed, heat sinking is sometimes accomplished by using large circuit board copper planes, or by affixing heat sinks atop the semiconductors, as shown in FIG. 2. However, a number of challenges arise because the mechanical mounting surface of the solder-mounted exposed tab package also serves as the electrical connection to the exposed tab. For instance, because the heat sinks shown in FIG. 2 are also electrically connected to the respective semiconductors, the voltage potential of the large heat sinks can reach a lethal level and thus pose a danger to service personnel. Additionally, because connecting multiple semiconductors to a common heat sink would result in electrically shorting the semiconductors to each other, each semiconductor requires its own separate heat sink. Moreover, employing large circuit board copper planes or large external heat sinks electrically connected to semiconductors to conduct heat away from the semiconductors can have deleterious effects on the performance of the electrical circuit, such as increased parasitic capacitance, and/or increased electromagnetic interference (EMI) generation and/or susceptibility.

Challenges that arise from employing a common heat sink for multiple semiconductor devices include that devices having different voltages on the exposed tab must be electrically isolated from the heat sink and/or each other, and additional mounting hardware may be required to secure the heat sink. Additionally, the need to repair and/or replace one or more semiconductor devices that share a heat sink with other semiconductor devices may require the removal of the external heat sinks, such as those shown in FIG. 2, which is time consuming.

The solder-mounted exposed tab semiconductor package is the preferred device package for many applications at least in part because of its pick-and-place mounting capability, performance enhancements, overall lower cost, and other benefits. However due to the drawbacks listed above, and others, there is a need for an improved system and method for thermal management of electronic devices.

SUMMARY

According to an aspect of the present disclosure, a thermal management system for electronic devices is provided that includes an electronic device, a heat sink, and a thermally-conducting and electrically-insulating thermal bridge. The thermal bridge is interposed between the electronic device and the heat sink, thermally couples the electronic device to the heat sink, and electrically isolates the electronic device from the heat sink. The electronic device, the heat sink, and the thermal bridge are mounted on a same planar surface of a printed circuit board.

In another aspect of the present disclosure, the electronic device is one of a set of electronic devices included in the system, and the thermal bridge is one of a set of thermal bridges included in the system. Each of the thermal bridges is interposed between the heat sink and a respective one of the electronic devices, thermally couples the respective one of the electronic devices to the heat sink, and electrically isolates the respective one of the electronic devices from the heat sink. The electronic devices, the thermal bridges, and the heat sink are mounted on the same planar surface of the printed circuit board.

In still another aspect of the present disclosure, the electronic devices are thermally coupled to the heat sink and are electrically isolated from the heat sink and from each other.

In another aspect of the present disclosure, the system further includes a second set of thermal bridges interposed between adjacent pairs of the electronic devices.

In another aspect of the present disclosure, the electronic devices are electrically coupled to each other by way of respective terminals thereof, thereby yielding a collective current handling capacity that is greater than individual current handling capacities of the electronic devices.

In another aspect of the present disclosure, the system further includes a temperature sensor coupled to the heat sink and arranged to sense temperature of the heat sink and the electronic devices.

In another aspect of the present disclosure, a set of the thermal bridges are interposed between the heat sink and a respective one of the electronic devices. The set of thermal bridges thermally couple the respective one of the electronic devices to the heat sink, and electrically isolate the respective one of the electronic devices from the heat sink.

In another aspect of the present disclosure, the electronic device is formed as an exposed tab semiconductor package that is solder-mounted to the printed circuit board.

In another aspect of the present disclosure, the heat sink is electrically coupled to an electrical ground.

In another aspect of the present disclosure, the thermal bridge is formed of aluminum nitride (AlN), boron nitride (BN), silicon nitride ($Si_3N_4$), aluminum oxide ($Al_2O_3$), and/or beryllium oxide (BeO).

According to another aspect of the present disclosure, a method of repairing a thermal management system for electronic devices is provided. The system includes a printed circuit board having fixed thereon a first electronic device, a heat sink, and a thermally conducting and electrically insulating thermal bridge. The thermal bridge is interposed between the first electronic device and the heat sink, thermally couples the first electronic device to the heat sink, and electrically isolates the first electronic device from the heat sink. The first electronic device, the heat sink, and the thermal bridge are mounted on a same planar surface of the printed circuit board. The method includes removing the first electronic device from the printed circuit board, while the heat sink and/or the thermal bridge remains affixed to the printed circuit board, and affixing a second electronic device to the printed circuit board in place of the first electronic device, while the heat sink and/or the thermal bridge remains affixed to the printed circuit board.

In another aspect of the present disclosure, the first electronic device is one of a set of electronic devices included in the system, and the thermal bridge is one of a set of thermal bridges included in the system. Each of the thermal bridges is interposed between the heat sink and a respective one of the electronic devices, thermally couples the respective one of the electronic devices to the heat sink, and electrically isolates the respective one of the electronic devices from the heat sink. The electronic devices, the thermal bridges, and the heat sink are mounted on the same planar surface of the printed circuit board. The method further includes removing a first group of the electronic devices from the printed circuit board while the heat sink and/or the thermal bridge remains affixed to the printed circuit board, and affixing a second group of electronic devices to the printed circuit board in place of the first group of the plurality of electronic devices, while the heat sink and/or the thermal bridge remains affixed to the printed circuit board.

In still another aspect of the present disclosure, the electronic devices are thermally coupled to the heat sink and are electrically isolated from the heat sink and from each other.

In another aspect of the present disclosure, the system further includes a second set of thermal bridges interposed between adjacent pairs of the set of electronic devices, and the second plurality of thermal bridges remains affixed to the printed circuit board during the removing of the first group of the plurality of electronic devices and/or the affixing of the second group of electronic devices.

In another aspect of the present disclosure, the electronic devices are electrically coupled to each other by way of a respective terminals thereof, and a set of the electronic devices remains affixed to the printed circuit board during the removing of the first group of the plurality of electronic devices and/or the affixing of the second group of electronic devices.

In another aspect of the present disclosure, the system further includes a temperature sensor coupled to the heat sink and arranged to sense temperature of the heat sink and the plurality of electronic devices. The temperature sensor remains affixed to the printed circuit board during the removing of the first group of the plurality of electronic devices and/or the affixing of the second group of electronic devices.

In another aspect of the present disclosure, a set of the thermal bridges are interposed between the heat sink and a respective one of the electronic devices, thermally couples the respective one of the electronic devices to the heat sink, and electrically isolates the respective one of the electronic devices from the heat sink. The thermal bridges remain affixed to the printed circuit board during the removing of the first group of the plurality of electronic devices and/or the affixing of the second group of electronic devices.

In another aspect of the present disclosure, the electronic device is formed as an exposed tab semiconductor package, and the affixing of the second electronic device includes mounting the second electronic device to the printed circuit board by using solder.

In another aspect of the present disclosure, the heat sink is electrically coupled to an electrical ground.

In another aspect of the present disclosure, the thermal bridge is formed of aluminum nitride (AlN), boron nitride (BN), silicon nitride ($Si_3N_4$), aluminum oxide ($Al_2O_3$), and/or beryllium oxide (BeO).

BRIEF DESCRIPTION OF THE DRAWINGS

The above and other aspects, features, and advantages of the present disclosure will become more apparent in light of the following detailed description when taken in conjunction with the accompanying drawings, in which.

DETAILED DESCRIPTION

Figure 3:
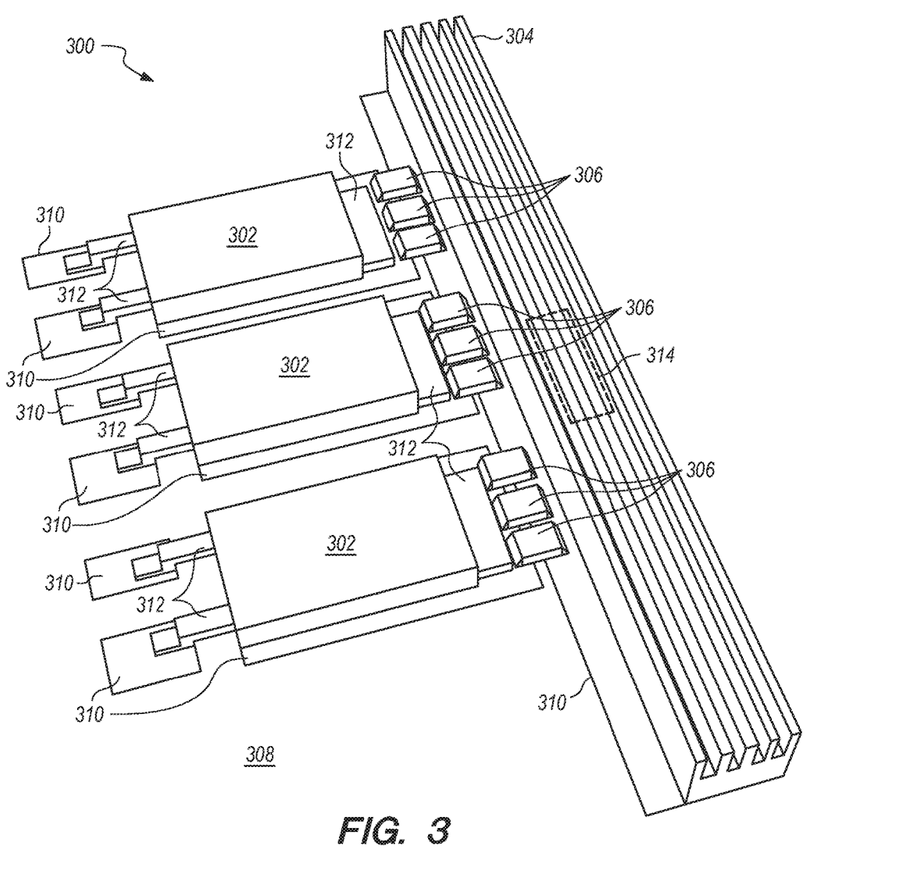
FIG. 3 shows a graphical representation of a thermal management system for electronic devices.

FIG. 3 shows a graphical representation of a thermal management system 300 for electronic devices. The system 300 includes one or more electronic devices 302, a heat sink 304, and one or more thermally-conducting and electrically-insulating thermal bridges 306. In one example, the semiconductor devices 302 are power field effect transistors (FETs) or other devices that, during operation, generate heat that must be conducted away from the devices to regulate the device temperature so as to remain within normal operational limits.

Each of the thermal bridges 306 is interposed between the heat sink 304 and a respective one of the electronic devices 302, thermally couples the respective one of the electronic devices 302 to the heat sink 304, and electrically isolates the respective one of the electronic devices 302 from the heat sink 304. In one example, multiple thermal bridges—three thermal bridges, in the example system 300—are interposed between the heat sink 304 and a respective one of the electronic devices 302, and thermally couple the respective one of the electronic devices 302 to the heat sink 304 and electrically isolate the respective one of the electronic devices 302 from the heat sink 304. The electronic devices 302, the heat sink 304, and the thermal bridges 306 are mounted on a same planar surface of a printed circuit board (PCB) 308, which, as described in further detail below, improves the serviceability of the electronic devices 302.

The package type of the electronic devices 302 can, for instance, be an exposed tab semiconductor package that is solder-mounted to the PCB 308. In this manner, the devices 302 can thus be pick-and-place mounted on the PCB 308, and solder can be employed as the mechanism for both mechanically and electrically coupling the devices 302 to the PCB 308, without the need for attached heat sinks or other related device after a reflow operation is performed.

The PCB 308 contains pads 310 of copper, or another conducting material, to which respective terminals 312 of the devices 302 are soldered, for both mechanical mounting purposes and electrical connection purposes. Instead of electrically coupling the pads 310 to a large copper (or other conducting material) plane of the PCB 308 as a heat sink, or affixing one or more external heat sinks atop the semiconductor devices 302, the thermal bridges 306 are arranged to thermally couple the electronic devices 302 to the heat sink 304, and electrically isolate the electronic devices 302 from the heat sink 304 and from each other. In this manner, the common heat sink 304 can be shared by the multiple electronic devices 302 to conduct heat away from each of the devices 302, without the devices 302 being electrically shorted to each other by way of the heat sink 304.

The thermal bridges 306 can be formed from any suitable thermally-conductive but electrically-insulating material that constitutes a good conductor of heat from the devices 302 to the heat sink 304, but maintains electrical isolation among the devices 302 and from each device 302 to the heat sink 304. Examples materials may have a thermal conductivity of at least 160 Watts per meter Kelvin (W/m*K), such as at least 400 Watts per meter Kelvin. Example types of material from which the thermal bridges 306 can be formed include, without limitation, aluminum nitride (AlN), boron nitride (BN), silicon nitride ($Si_3N_4$), aluminum oxide ($Al_2O_3$), and/or beryllium oxide (BeO), but compounds or materials exhibiting similar chemical or physical properties may also be suitable.

In different examples, the thermal bridges 306 may be formed from a thermally isotropic material or a thermally orthotropic material. A thermally orthotropic material may include a material that is arranged during the fabrication of thermal bridge 306 to exhibit thermally orthotropic properties. In general, a thermally orthotropic material exhibits a thermal conductivity in one direction that is different from a thermal conductivity in at least one other direction. By contrast, a thermally isotropic material generally exhibits substantially equal thermal conductivities in every direction. Because some thermally orthotropic materials exhibit thermal conductivities in at least one direction that are greater than the thermal conductivities exhibited by standard isotropic materials, employing a thermally orthotropic material in the thermal bridges 306 may, in some examples, increase heat transfer rates away from the electrical devices 302 relative to using thermal bridges fabricated from a thermally isotropic material. Examples of isotropic materials that may be used to fabricate the thermal bridges 306 include, but are not limited to, copper, aluminum, beryllium and alloys thereof. Examples of orthotropic materials that may be used to fabricate the thermal bridges 306 include, but are not limited to, oriented carbon fibers, such as oriented graphite fibers and oriented carbon fibers with a granular microstructure. It should be appreciated, however, that the foregoing isotropic and orthotropic materials are only examples, and the embodiments of the disclosure are not limited to thermal bridges fabricated from any particular material.

Because the cost of individual heat sinks can be considerable, by employing a single heat sink 304 to sink the heat from multiple devices 302—while ensuring that the common heat sink does not electrically short the devices to each other—the system 300 can be a more cost-effective solution than employing individual heat sinks for each of the devices 302.

Additionally, employing large copper pours to carry the heat transfer load required for electronic devices can increase the amount of PCB area (sometimes referred to as PCB real estate) required and can limit the amount of PCB area that is available for routing electrically conducting traces between devices. By avoiding the need to employ such large copper pours, the system 300 can provide a solution that more efficiently utilizes PCB area and is thus more cost-effective.

Moreover, in one example, the amount of copper poured under the respective devices 302, for instance, in the respective larger, right-most ones of the pads 310 depicted in FIG. 3, is only enough to enable the device 302 to be coupled to the respective thermal bridges 306. The relatively small copper pours employed in this example can significantly reduce the generation of, and/or susceptibility to, electromagnetic interference (EMI), radio frequency interference (RFI), and crosstalk by the devices 302.

In another example, the heat sink 304 is electrically coupled to an electrical ground, thus improving the safety and serviceability of the PCB 308 and components thereof by eliminating dangerous voltages on the heat sink 304 and instead ensuring that the heat sink 304 remains at ground potential.

Figure 4:
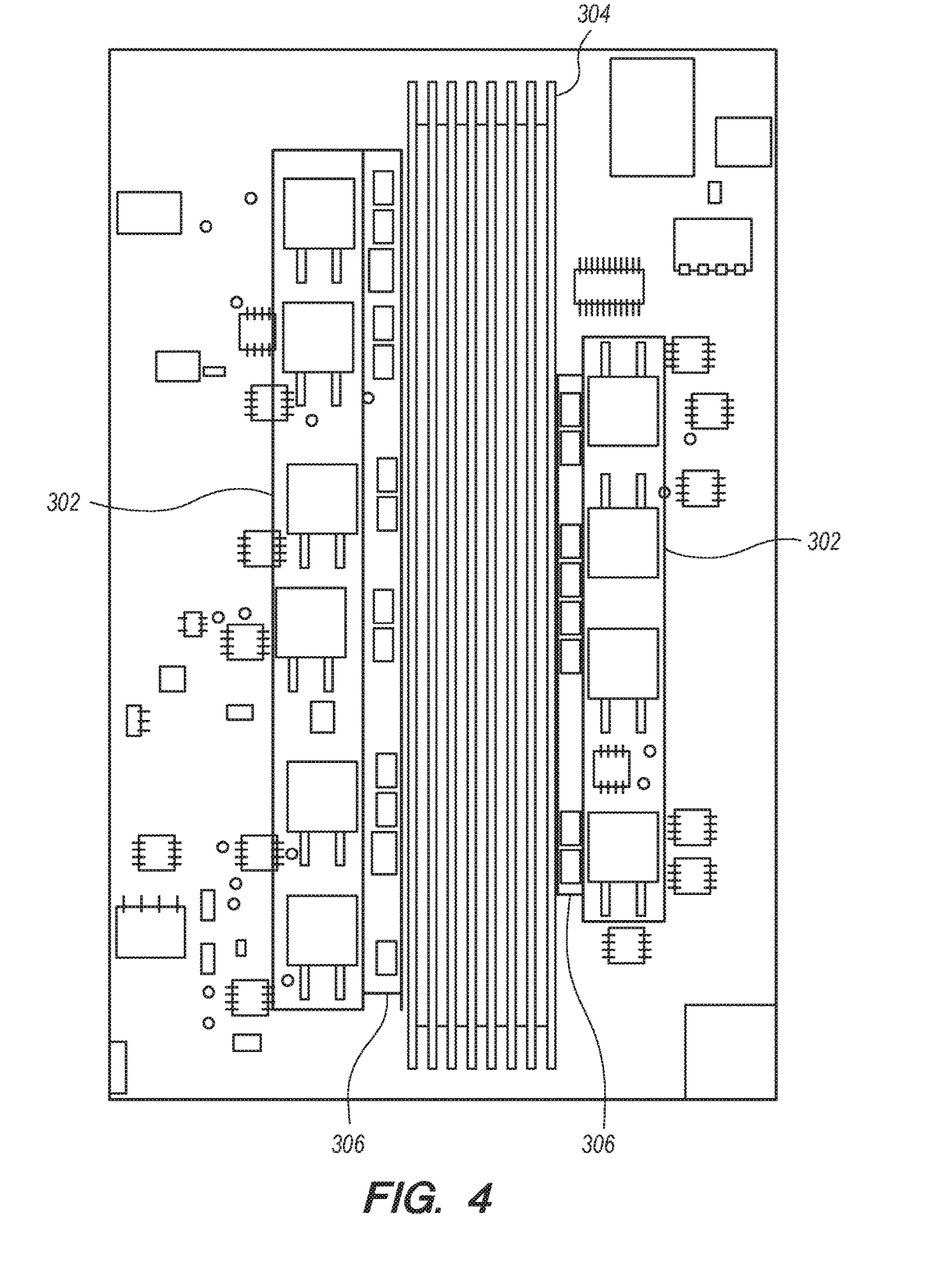
FIG. 4 shows an example implementation of the thermal management system shown in FIG. 3.

FIG. 4 shows an example implementation of the thermal management system 300 described above in the context of FIG. 3. In this implementation, the thermal transfer from ten semiconductor devices 302 (FETs, in this example) is handled by the heat sink 304 while keeping the devices 302, the heat sink 304, and the thermal bridges 306 in close proximity to each other. The rows of devices 302 are arranged on either side of the heat sink 304 such that each device 302 is in close proximity to its neighboring device 302, and also close to the heat sink 304. The configuration yields short device-to-device interconnects and good thermal transfer to the heat sink 304.

Because the common heat sink 304 is shared by all the devices 302 and all the devices 302 are in close proximity to each other, a single temperature sensor 314 placed beneath the heat sink 304 can adequately monitor the temperatures of all the devices 302.

In the example implementation of FIG. 4, as also noted above in the context of FIG. 3, the amount of copper poured under the respective devices 302 is only the relatively small amount required to enable the devices 302 to be coupled to the respective thermal bridges 306. The relatively small copper pours employed in this example can significantly reduce the generation of, and/or susceptibility to, electromagnetic interference (EMI), radio frequency interference (RFI), and crosstalk by the devices 302, and can also reduce the interconnect trace lengths, inductance, resistance, and other circuit parasitics.

Although not shown in FIG. 3 or FIG. 4, in one example, the system 300 further includes multiple thermal bridges that are interposed between adjacent pairs of the electronic devices 302, for example, coupling each pad 310 of one of the devices 302 to a corresponding pad 310 of another one of the devices 302. In this manner, the thermal coupling among the devices 302 can be increased, thus yielding a more uniform temperature distribution among the devices 302. In some examples, the electronic devices 302 can also be electrically coupled to each other in parallel by way of respective terminals thereof—such as power output terminals thereof—thereby yielding a current handling capacity of the collective devices 302 that is greater than current handling capacities of individual ones of the electronic devices 302. Employing thermal bridges interposed between the devices 302 in the manner described above can be beneficial, for instance, in applications involving the parallel coupling of multiple devices, such as diodes, having a negative temperature coefficient that complicates the ability to couple the devices in parallel unless the devices remain at a similar temperature. The system 300 can further include a temperature sensor 314 coupled to the heat sink 304 and arranged to sense the temperature of the heat sink 304 and the electronic devices 302.

Figure 5:
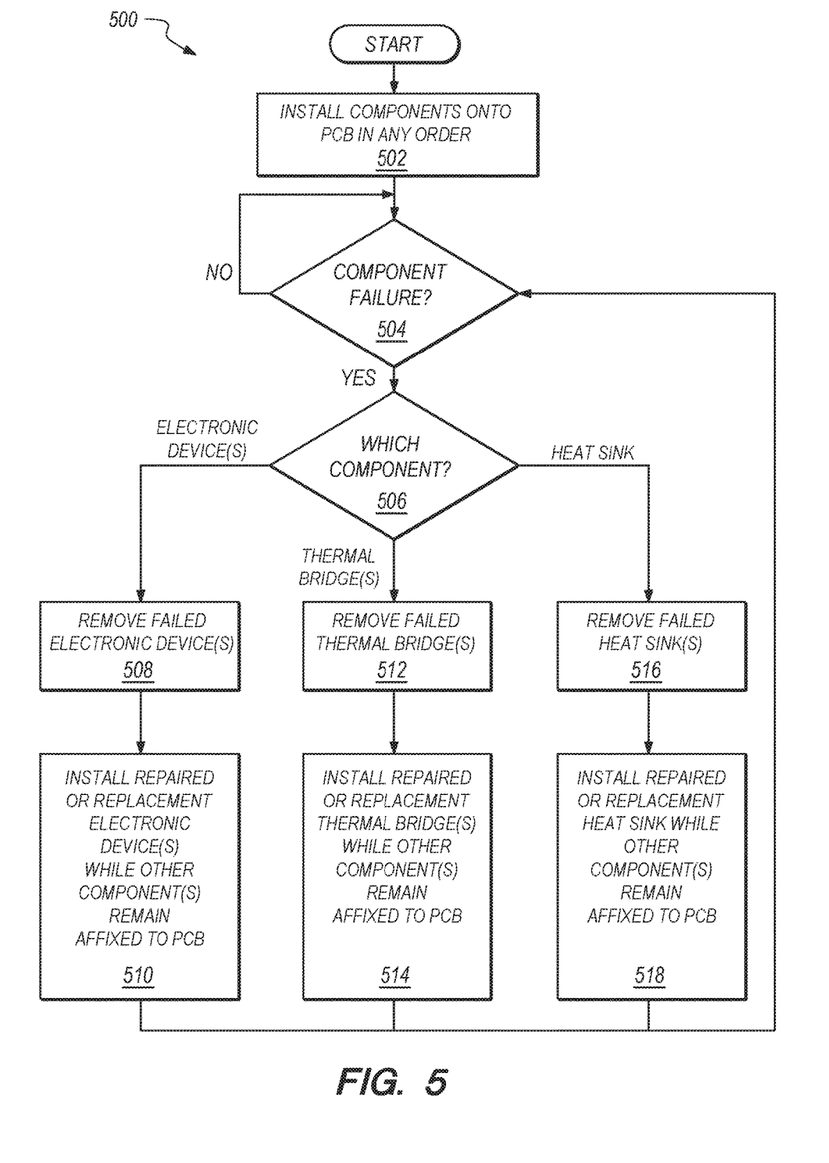
FIG. 5 illustrates an example procedure for manufacturing and/or repairing a thermal management system such as the system of FIG. 3 and/or FIG. 4.

Having described an example thermal management system 300 for electronic devices and an example implementation thereof, reference will now be made to FIG. 5, which illustrates an example procedure 500 for manufacturing and/or repairing a thermal management system such as the system 300. At block 502, one or more electronic devices 302, heat sinks 304, and/or thermal bridges 306 are installed—in any order—onto the PCB 308, for example by being affixed thereto using solder or another adhesive. As described above in the context of FIG. 3, the thermally-conducting and electrically-insulating thermal bridges 306 are interposed between the electronic devices 302 and the heat sink 304, and thermally couple the respective electronic devices 302 to the heat sink 304 and electrically isolate the electronic devices 302 from the heat sink 304. The electronic device 302, the heat sink 304, and the thermal bridges 306 are mounted on the same planar surface of the PCB 308, and thus, as described in further detail below, the serviceability of the components installed on the PCB 308 is improved since each component can be removed, repaired, and/or replaced independently of each other component.

At block 504, a determination is made as to whether any of the installed components—the one or more electronic devices 302, heat sinks 304, and/or thermal bridges 306 installed at block 502—has failed and/or needs repair and/or replacement. If it is determined at block 504 that none of the installed components has failed and/or needs repair and/or replacement ("NO" at block 504), then control remains at block 504 to continuously and/or periodically determine whether an installed component has failed. If, on the other hand, it is determined at block 504 that one of the installed components has failed and/or needs repair and/or replacement ("YES" at block 504), then control passes to block 506. At block 506, a determination is made as to which of the installed components—the one or more electronic devices 302, heat sinks 304, and/or thermal bridges 306 installed at block 502—has failed and/or needs repair and/or replacement.

If it is determined at block 506 that one or more of the electronic devices 302 installed at block 502 has failed and/or needs repair and/or replacement ("ELECTRONIC DEVICE(S)" at block 506), then control passes to block 508. At block 508, the one or more of the electronic devices 302 that has failed and/or needs repair and/or replacement is removed from the PCB 308 while the other components installed at block 502—the other electronic device(s) 302, heat sinks 304, and/or thermal bridges 306 installed at block 502—remain affixed to the PCB 308. At block 510, another electronic device 302—which may be a repaired version of the one or more electronic devices 302 that was removed from the PCB 308 at block 508 or may be a new replacement electronic device 302—is installed onto the PCB 308 in the location from which the failed electronic device 302 was removed, while the other components installed at block 502—the other electronic device(s) 302, heat sinks 304, and/or thermal bridges 306 installed at block 502—remain affixed to the PCB 308. A package type of the one or more electronic devices 302 is, in one example, an exposed tab semiconductor package, and the installing of the electronic device(s) 302 at block 510 includes mounting the electronic device(s) to the PCB 308 by using solder. Then, at block 504, another determination is made, in the manner described above, so as to continuously and/or periodically determine whether another installed component has failed.

If it is determined at block 506 that one or more of the thermal bridges 306 installed at block 502 has failed and/or needs repair and/or replacement ("THERMAL BRIDGE (S)" at block 506), then control passes to block 512. At block 512, the one or more of the thermal bridges 306 that has failed and/or needs repair and/or replacement is removed from the PCB 308 while the other components installed at block 502—the other electronic device(s) 302, heat sinks 304, and/or thermal bridges 306 installed at block 502—remain affixed to the PCB 308. At block 514, another thermal bridge 306—which may be a repaired version of the one or more thermal bridges 306 that was removed from the PCB 308 at block 508 or may be a new replacement thermal bridge 306—is installed onto the PCB 308 in the location from which the failed thermal bridge 306 was removed, while the other components installed at block 502—the other electronic device(s) 302, heat sinks 304, and/or thermal bridges 306 installed at block 502—remain affixed to the PCB 308. Then, at block 504, another determination is made, in the manner described above, so as to continuously and/or periodically determine whether another installed component has failed.

If it is determined at block 506 that the heat sink 304 installed at block 502 has failed and/or needs repair and/or replacement ("HEAT SINK" at block 506), then control passes to block 516. At block 516, the heat sink 304 that has failed and/or needs repair and/or replacement is removed from the PCB 308 while the other components installed at block 502—the other electronic device(s) 302, heat sinks 304, and/or thermal bridges 306 installed at block 502—remain affixed to the PCB 308. At block 518, another heat sink 304—which may be a repaired version of the heat sink 304 that was removed from the PCB 308 at block 508 or may be a new replacement heat sink 304—is installed onto the PCB 308 in the location from which the failed heat sink 304 was removed, while the other components installed at block 502—the other electronic device(s) 302, heat sinks 304, and/or thermal bridges 306 installed at block 502—remain affixed to the PCB 308. Then, at block 504, another determination is made, in the manner described above, so as to continuously and/or periodically determine whether another installed component has failed.

In another example, as described above in the context of FIG. 3, the system 300 includes a temperature sensor 314 (not shown in FIG. 4) coupled to the heat sink 304 and arranged to sense the temperature of the heat sink 304 and the electronic devices 302. The temperature sensor 314 can remain affixed to the PCB 308 during the removal, repair, and/or replacement of a failed component at any one of blocks 508, 510, 512, 514, 516, and/or 518 described above.

In still another example, as described above in the context of FIG. 3, multiple thermal bridges 306 are interposed between the heat sink 304 and a respective one of the electronic devices 302, thermally couple the respective one of the electronic devices 302 to the heat sink 304, and electrically isolate the respective one of the electronic devices 302 from the heat sink 304. The thermal bridges 306 remain affixed to the PCB 308 during the removal, repair, and/or replacement of a failed component at any one of blocks 508, 510, 512, 514, 516, and/or 518 described above.

The embodiments disclosed herein are examples of the disclosure and may be embodied in various forms. For instance, although certain embodiments herein are described as separate embodiments, each of the embodiments herein may be combined with one or more of the other embodiments herein. Specific structural and functional details disclosed herein are not to be interpreted as limiting, but as a basis for the claims and as a representative basis for teaching one skilled in the art to variously employ the present disclosure in virtually any appropriately detailed structure Like reference numerals may refer to similar or identical elements throughout the description of the figures.

The phrases "in an embodiment," "in embodiments," "in some embodiments," or "in other embodiments" may each refer to one or more of the same or different embodiments in accordance with the present disclosure. A phrase in the form "A or B" means "(A), (B), or (A and B)." A phrase in the form "at least one of A, B, or C" means "(A); (B); (C); (A and B); (A and C); (B and C); or (A, B, and C)." The term "clinician" may refer to a clinician or any medical professional, such as a doctor, nurse, technician, medical assistant, or the like, performing a medical procedure.

The systems described herein may also utilize one or more controllers to receive various information and transform the received information to generate an output. The controller may include any type of computing device, computational circuit, or any type of processor or processing circuit capable of executing a series of instructions that are stored in a memory. The controller may include multiple processors and/or multicore central processing units (CPUs) and may include any type of processor, such as a microprocessor, digital signal processor, microcontroller, programmable logic device (PLD), field programmable gate array (FPGA), or the like. The controller may also include a memory to store data and/or instructions that, when executed by the one or more processors, causes the one or more processors to perform one or more methods and/or algorithms.

Any of the herein described methods, programs, algorithms or codes may be converted to, or expressed in, a programming language or computer program. The terms "programming language" and "computer program," as used herein, each include any language used to specify instructions to a computer, and include (but is not limited to) the following languages and their derivatives: Assembler, Basic, Batch files, BCPL, C, C+, C++, Delphi, Fortran, Java, JavaScript, machine code, operating system command languages, Pascal, Perl, PL1, scripting languages, Visual Basic, metalanguages which themselves specify programs, and all first, second, third, fourth, fifth, or further generation computer languages. Also included are database and other data schemas, and any other meta-languages. No distinction is made between languages which are interpreted, compiled, or use both compiled and interpreted approaches. No distinction is made between compiled and source versions of a program. Thus, reference to a program, where the programming language could exist in more than one state (such as source, compiled, object, or linked) is a reference to any and all such states. Reference to a program may encompass the actual instructions and/or the intent of those instructions.

Any of the herein described methods, programs, algorithms or codes may be contained on one or more machine-readable media or memory. The term "memory" may include a mechanism that provides (e.g., stores and/or transmits) information in a form readable by a machine such a processor, computer, or a digital processing device. For example, a memory may include a read only memory (ROM), random access memory (RAM), magnetic disk storage media, optical storage media, flash memory devices, or any other volatile or non-volatile memory storage device. Code or instructions contained thereon can be represented by carrier wave signals, infrared signals, digital signals, and by other like signals.

It should be understood that the foregoing description is only illustrative of the present disclosure. Various alternatives and modifications can be devised by those skilled in the art without departing from the disclosure. Accordingly, the present disclosure is intended to embrace all such alternatives, modifications and variances. The embodiments described with reference to the attached drawing figures are presented only to demonstrate certain examples of the disclosure. Other elements, steps, methods, and techniques that are insubstantially different from those described above and/or in the appended claims are also intended to be within the scope of the disclosure.

What is claimed is:

1. A thermal management system for electronic devices, comprising:
    at least one electronic device;
    a heat sink;
    a thermally-conducting and electrically-insulating thermal bridge that is interposed between the at least one electronic device and the heat sink and that thermally couples the at least one electronic device to the heat sink and electrically isolates the at least one electronic device from the heat sink, wherein the at least one electronic device, the heat sink, and the thermal bridge are mounted on a same planar surface of a printed circuit board and are arranged so as not to overlap each other when viewed along an axis perpendicular to the planar surface of the printed circuit board, wherein:
the at least one electronic device is one of a plurality of electronic devices included in the system,
the thermal bridge is one of a first plurality of thermal bridges included in the system,
each of the first plurality of thermal bridges is interposed between the heat sink and a respective one of the plurality of electronic devices, and thermally couples the respective one of the plurality of electronic devices to the heat sink and electrically isolates the respective one of the plurality of electronic devices from the heat sink, and
the plurality of electronic devices, the first plurality of thermal bridges, and the heat sink are mounted on the same planar surface of the printed circuit board; and
a second plurality of thermal bridges interposed between adjacent pairs of the plurality of electronic devices.

2. The system of claim 1, wherein the plurality of electronic devices are thermally coupled to the heat sink and electrically isolated from the heat sink and from each other.

3. The system of claim 1, wherein the plurality of electronic devices are electrically coupled to each other by way of a plurality of respective terminals thereof, thereby yielding a collective current handling capacity that is greater than individual current handling capacities of ones of the plurality of electronic devices.

4. The system of claim 1, further comprising a temperature sensor coupled to the heat sink and arranged to sense temperature of the heat sink and the plurality of electronic devices.

5. The system of claim 1, wherein the at least one electronic device is formed as an exposed tab semiconductor package that is solder-mounted to the printed circuit board.

6. The system of claim 1, wherein the heat sink is electrically coupled to an electrical ground.

7. The system of claim 1, wherein the thermal bridge is formed of at least one of aluminum nitride, boron nitride, silicon nitride, aluminum oxide, or beryllium oxide.

8. A method of repairing a thermal management system for electronic devices,
wherein the system comprises:
a printed circuit board having affixed thereon:
a first electronic device;
a heat sink;
a thermally conducting and electrically insulating thermal bridge that is interposed between the first electronic device and the heat sink and that thermally couples the first electronic device to the heat sink and electrically isolates the first electronic device from the heat sink,
wherein the first electronic device, the heat sink, and the thermal bridge are mounted on a same planar surface of a printed circuit board and are arranged so as not to overlap each other when viewed along an axis perpendicular to the planar surface of the printed circuit board;
and the method comprises:
removing the first electronic device from the printed circuit board while at least one of the heat sink or the thermal bridge remains affixed to the printed circuit board, and
affixing a second electronic device to the printed circuit board in place of the first electronic device while at least one of the heat sink or the thermal bridge remains affixed to the printed circuit board, wherein:
the first electronic device is one of a plurality of electronic devices included in the system,
the thermal bridge is one of a first plurality of thermal bridges included in the system,
each of the first plurality of thermal bridges is interposed between the heat sink and a respective one of the plurality of electronic devices, and thermally couples the respective one of the plurality of electronic devices to the heat sink and electrically isolates the respective one of the plurality of electronic devices from the heat sink, and
the plurality of electronic devices, the first plurality of thermal bridges, and the heat sink are mounted on the same planar surface of the printed circuit board and are arranged so as not to overlap each other when viewed along the axis perpendicular to the planar surface of the printed circuit board; and
removing a first group of the plurality of electronic devices from the printed circuit board while at least one of the heat sink or the thermal bridge remains affixed to the printed circuit board, and
affixing a second group of electronic devices to the printed circuit board in place of the first group of the plurality of electronic devices while at least one of the heat sink or the thermal bridge remains affixed to the printed circuit board; and
wherein the system comprises:
a second plurality of thermal bridges, wherein, before the removing of the first group of the plurality of electronic devices from the printed circuit board, the second plurality of thermal bridges are interposed between adjacent pairs of the first group of the plurality of electronic devices, and wherein the second plurality of thermal bridges remains affixed to the printed circuit board during at least one of the removing of the first group of the plurality of electronic devices or the affixing of the second group of electronic devices.

9. The method of claim 8, wherein the plurality of electronic devices are thermally coupled to the heat sink and electrically isolated from the heat sink and from each other.

10. The method of claim 8, wherein the plurality of electronic devices are electrically coupled to each other by way of a plurality of respective terminals thereof, and a subset of the plurality of electronic devices remains affixed to the printed circuit board during at least one of the removing of the first group of the plurality of electronic devices or the affixing of the second group of electronic devices.

11. The method of claim 8, wherein the system further comprises a temperature sensor coupled to the heat sink and arranged to sense temperature of the heat sink and the plurality of electronic devices, and wherein the temperature sensor remains affixed to the printed circuit board during at least one of the removing of the first group of the plurality of electronic devices or the affixing of the second group of electronic devices.

12. The method of claim 8, wherein the first electronic device is formed as an exposed tab semiconductor package, and the affixing of the second electronic device includes mounting the second electronic device to the printed circuit board by using solder.

13. The method of claim 8, wherein the heat sink is electrically coupled to an electrical ground.

14. The method of claim 8, wherein the thermal bridge is formed of at least one of aluminum nitride, boron nitride, silicon nitride, aluminum oxide, or beryllium oxide.

\* \* \* \* \*